United States Patent [19]

Panish

[11] 4,184,171
[45] Jan. 15, 1980

[54] LIGHT EMITTING DIODES WHICH EMIT IN THE INFRARED

[75] Inventor: Morton B. Panish, Springfield, N.J.

[73] Assignee: Bell Telephone Laboratories, Incorporated, Murray Hill, N.J.

[21] Appl. No.: 921,983

[22] Filed: Jul. 5, 1978

[51] Int. Cl.$^2$ .................. H01S 33/19; H01L 33/00
[52] U.S. Cl. .................................. 357/18; 357/17; 357/16; 331/94.5 H
[58] Field of Search ............. 357/17, 18, 16, 61; 331/94.5 H

[56] References Cited

U.S. PATENT DOCUMENTS

| | | | |
|---|---|---|---|
| 3,982,261 | 9/1976 | Antypas | 357/16 |
| 3,995,303 | 11/1976 | Nahory | 357/30 |
| 4,032,951 | 6/1977 | DeWinter | 357/17 |
| 4,086,608 | 4/1978 | Clawson | 357/17 |
| 4,105,955 | 8/1978 | Hayashi | 331/94.5 H |
| 4,122,407 | 10/1978 | Van Vechlen | 331/94.5 H |

*Primary Examiner*—Martin H. Edlow
*Attorney, Agent, or Firm*—Michael J. Urbano

[57] ABSTRACT

A semiconductor double heterostructure (DH) laser or spontaneous emitting diode is described which emits radiation in the infrared region of the spectrum from about 3.5 to 5.5 micrometers. The DH structure comprises a Group III–V lattice-matched system, in particular, $Al_yGa_{1-y}Sb$—$InAs_xSb_{1-x}$ where $0 \leq y \leq 1$ and $0.82 \leq x \leq 0.91$, approximately.

8 Claims, 4 Drawing Figures

LIGHT EMITTING DIODES WHICH EMIT IN THE INFRARED

BACKGROUND OF THE INVENTION

1. Field of the Invention

This invention relates to double heterostructure (DH) light emitting diodes, and more particularly, to DH junction lasers or spontaneous emission diodes which emit radiation in the infrared region.

2. Description of the Prior Art

The advancement of optical communications technology depends on the development of inexpensive and reliable components, i.e., optical sources, receivers, detectors and transmission means. A major advancement in the field was the development of low loss optical fibers for transmission of optical signals. For example, the silica fibers currently in use transmit light and exhibit low loss on the order of 1-2 db/km in the near infrared region from about 0.7 to 2 micrometers wavelength. In order to exploit such fibers, the optical sources should emit light in the wavelength region where the fibers exhibit fairly low loss. Thus, a second significant advance in this technology was the development DH junction lasers which operate CW at room temperature. The lowest threshold and more reliable DH lasers today are fabricated from the $Al_xGa_{1-x}As$-GaAs system and emit in the range of about 0.8 to 0.9 micrometers.

Briefly, the DH laser comprises a narrow bandgap active region which may be either n- or p-type, or contain a p-n junction. The active region is sandwiched between relatively wider bandgap, opposite-conductivity-type cladding layers which form two heterojunctions, one at each interface with the active region. These heterojunctions serve to confine injected carriers, as well a stimulated radiation, to the active region. Consequently, the heterojunctions should have as few defects as possible since such defects act as nonradiative recombination centers and tend to reduce efficiency and increase lasing thresholds. Thus, it is important that the layers be nearly lattice matched at the growth temperature and at the operating temperature of the laser. The need for lattice-matched materials is another reason why the $Al_xGa_{1-x}As$-GaAs system has been so intensively studied; the lattice constants for $Al_xGa_{1-x}As$ and GaAs are approximately equal for all values of x. Thus, highly quality heterojunctions can be formed.

Recently a novel fiber comprising zinc chloride has been discovered and described by W. H. Grodkiewicz et al in U.S. application Ser. No. 885,198, filed on Mar. 10, 1978, and assigned to the assignee hereof. This fiber is capable of transmitting radiation in the range of 1-7 micrometers. However, from about 3.0 to 4.5 micrometers the fiber exhibits extremely low loss on the order of $10^{-3}$ db/km. Therefore, an optical source which emits radiation in this wavelength range would be of great interest.

SUMMARY OF THE INVENTION

FIG. 1 shows that the direct energy gap for indium arsenide antimonide ($InAs_xSb_{1-x}$) for $x \geq 0.8$ is 0.225-0.350 eV. Correspondingly, it will permit emission from about 3.5 to 5.5 micrometers at 300 degrees K. The wavelength decreases by approximately $1.7 \times 10^{-3}$ micrometers per degree (C.) of temperature decrease. Thus, a light emitting device wherein the active region comprises $InAs_xSb_{1-x} x \geq 0.8$, will be suitable for use with a zinc chloride fiber, for example.

The invention is directed to a DH light emitting diode such as a laser diode or a spontaneous emission diode (LED) comprising an active region of $InAs_xSb_{1-x}$ where $0.82 \leq x \leq 0.91$ sandwiched between the first and second cladding layers of $Al_yGa_{1-y}Sb$, $0 \leq y \leq 1$, the $Al_yGa_{1-y}Sb$ being substantially lattice matched to the $InAs_xSb_{1-x}$.

In $As_xSb_{1-x}$ having x in the range specified above can be lattice matched to $Al_yGa_{1-y}Sb$, there being an essentially perfect lattice matched composition y of $Al_yGa_{1-y}Sb$ for each composition x of $InAs_xSb_{1-x}$. Furthermore the change of the lattice parameter of $Al_yGa_{1-y}Sb$ is quite small, only about 0.6%, between $Y=0$ and $y=1$, which facilitates epitaxy of the lattice matching compositions. In addition, the limiting binary-ternary combinations, namely $AlSb-InAs_{0.82}Sb_{0.18}$ and $GaSb-InAs_{0.91}Sb_{0.09}$, are advantageous because the binary compounds can be obtained as bulk crystals. It should also be noted that even when ternaries within these limits ($0.82 < x < 0.91$ and $0 < y < 1$) are used only a small correction to the lattice parameter needs to be made by grading from a GaSb or AlSb substrate. In all cases described an essentially perfect lattice match can be achieved between the indicated range of ternary active regions and binary or ternary cladding layers for active regions that yield emission at wavelengths within the desired range of approximately 3.5-5.5 micrometers. Furthermore, the difference in energy gap between the binary or ternary cladding layers and the active region is much greater than can be achieved with $GaAs-Al_xGa_{1-x}As$ heterojunctions and ensures excellent carrier confinement. The difference in refractive index is not well established, but by analogy to other Group III-V systems, would be expected to be adequate for optical confinement.

DETAILED DESCRIPTION

The invention is directed to a DH light emitting diode comprising a novel material system which will emit radiation in a selected part of the infrared region of the spectrum. The material system is lattice matched $Al_yGa_{1-y}Sb-InAs_xSb_{1-x}$ where $0 \leq y \leq 1$ and approximately $0.82 \leq x \leq 0.91$. Although the term light emitting diode is used to refer to both a laser diode and a spontaneously emitting diode, the discussion will be directed to a laser diode.

Figure 3:
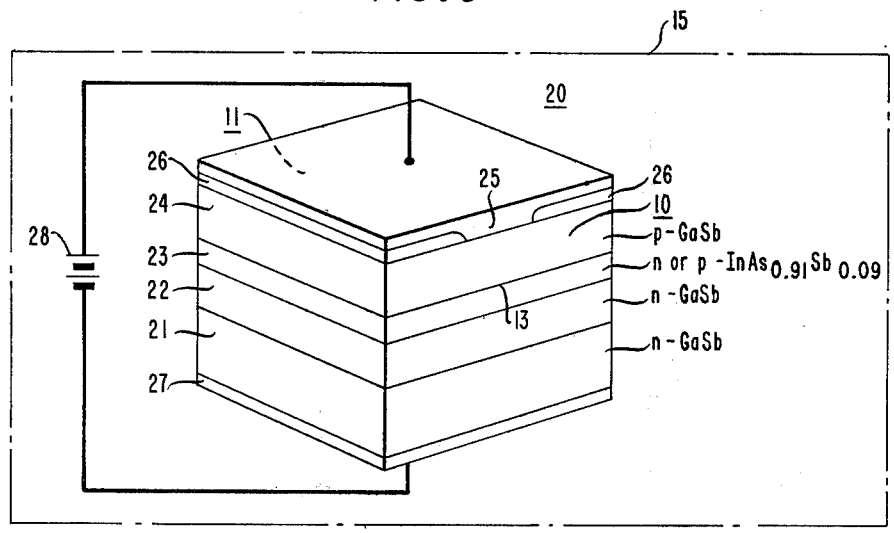
FIG. 3 illustrates an oxide masked stripe geometry DH laser comprising $GaSb-InAs_xSb_{1-x}$.

FIG. 3 shows a DH laser structure which is illustratively an oxide masked stripe geometry laser. The DH laser 20 basically comprises a single crystal substrate (semiconductor body) 21 on which are epitaxially grown a wide bandgap first cladding layer 22, a narrower bandgap active region 23, and a wire bandgap second cladding layer 24.

Cladding layers 22 and 24 are generally of opposite conductivity type and form heterojunctions at the interface between layers 23 and 22 and between 23 and 24. The heterojunctions confine radiation in the dimension perpendicular to the junction plane. Recombination of holes and electrons takes place in the active region 23 when p-n juntion 13 is forward biased above the lasing threshold by means of source 28 connected between the ohmic contact 27 and stripe geometry ohmic contact 25 formed by masking and etching a silicon dioxide layer 26 as shown. Heat sink means are generally attached to contact 25.

Figure 1:
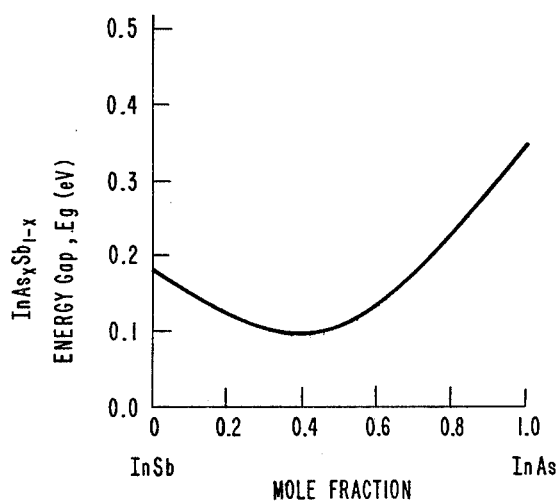
FIG. 1 shows the compositionally dependent bandgap, $E_g$, for $InAs_xSb_{1-x}$ at 300 degrees K.; the entire curve is about 0.6 eV lower at 0 degrees K.
Figure 2:
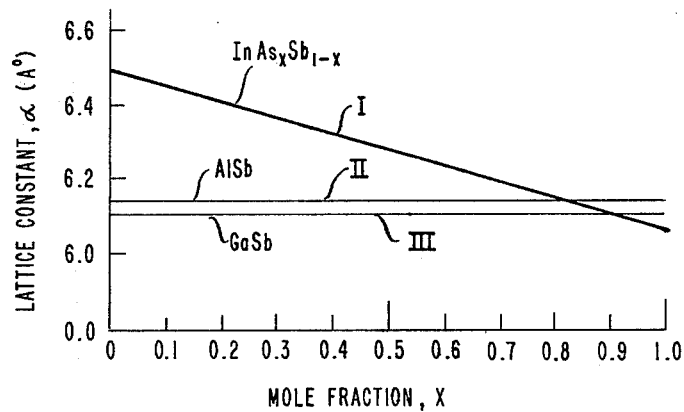
FIG. 2 shows a plot of lattice constant vs. mole fraction for $InAs_xSb_{1-x}$ and the binary compounds aluminum antimonide (AlSb) and gallium antimonide (GaSb) to illustrate the lattice matching ranges of $Ga_yAl_{1-y}Sb$ and $InAs_xSb_{1-x}$.

In order to reduce the number of defects, and hence the number of nonradiative recombination sites, at the heterojunctions, it is desirable to match the lattice constants of the cladding layers 22 and 24 with the active region 23. FIG. 2 is a plot of lattice constants for the binary compounds GaSb and AlSb and the ternary compound $InAs_xSb_{1-x}$. The points where the ternary compound plot (Line I) intersects the binary compound plots (Lines II and III) are the points where the lattice constants are equal at 300 degrees K. These values are taken to be x=0.82 for AlSb and x=0.91 for GaSb although a small amount of fine tuning may be required to determine the precise lattice matching compositions to better than 1%. Furthermore, for $Al_yGa_{1-y}Sb$, $0 \leq y \leq 1$, $InAs_xSb_{1-x}$ can be lattice matched over the range $0.82 \leq x \leq 0.91$, approximately.

Returning now to FIG. 3, opposite end surfaces 10 and 11 are typically cleaved facets formed parallel to one another and perpendicular to the layers to define an optical cavity resonator. The cleaved facets are partially transmissive to permit output of a portion of the radiation from the resonator. Alternatively, in an integrated optical circuit, one or both mirrors could be formed instead by distributed feedback means such as diffraction gratings.

In particular, laser 20 is fabricated from the $Al_yGa_{1-y}Sb-InAs_xSb_{1-x}$ system as follows; an n-GaSb (100) oriented substrate 21, an n-GaSb cladding layer 22, an active region comprising either an n- or p- $InAs_{0.91}Sb_{0.09}$ layer, and a p-GaSb cladding layer 24. The thickness of active region 13 may range from about 1.5 to 0.15 micrometers. The thickness of the cladding layers depends on the thickness of the active region and should be somewhat greater than one micrometer for the thinner active regions. At 0 degrees K., the emission energy is 0.347 eV corresponding to a wavelength of 3.6 micrometers and, at 300 degrees K., the emission energy is 0.287 eV corresponding to a wavelength of about 4.3 micrometers. Since this is narrow energy gap material, the laser may have to be cooled below room temperature by cooling means 15 and will probably emit radiation on the order of about 4 micrometers.

GaSb bulk crystals may be purchased from commercial sources and this laser may be fabricated either by standard molecular beam epitaxy (MBE) technique or liquid phase epitaxy (LPE). Also, organo-metallic chemical vapor deposition (CVD) can be utilized wherein $Sb(CH_3)_3$ is combined with $AsH_3$ and $In(CH_3)_3$.

Figure 4:
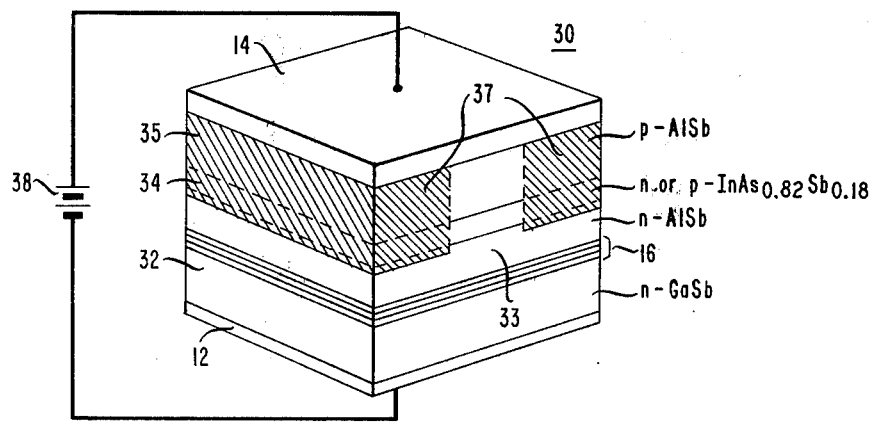
FIG. 4 is a portion bombarded stripe geometry DH laser comprising $AlSb-InAs_xSb_{1-x}$.

FIG. 4 shows another embodiment of the invention. FIG. 4 is a DH laser in which the stripe geometry is defined by proton bombardment such as that described by L. A. D'Asaro et al in U.S. Pat. No. 3,824,133 issued on July 15, 1974. Laser 30 comprises an n-type GaSb substrate 32 on which is grown a plurality of step-graded index matching layers 16 of $Al_yGa_{1-y}Sb$ where y ranges from 0 to 1, an n-type AlSb cladding layer 33, followed by either an n- or p-type $In_{0.82}As_{0.18}Sb$ active region 34 and a p-type AlSb cladding layer 35. Proton bombarded areas 37 have high resistivity and confine the current in a narrow channel. Light is emitted from the central region of active region 34 when the device is forward biased by source 38 connected to ohmic contacts 12 and 14.

AlSb may be prepared as a bulk crystal, and so substrate 32 may be AlSb alone. However, AlSb may be difficult to work with since it is so easily oxidized. Referring back to FIG. 2, it is seen that the lattice constant for GaSb and AlSb differ by only about 0.6%. Therefore, it may be advantageous to step-grade from GaSb to AlSb in order to accommodate the lattice constant difference. That is, layers 16 of $Al_yGa_{1-y}Sb$ are grown on a GaSb substrate with y increasing from 0 to 1 with distance from the GaSb substrate.

At 0 degrees K., the emission energy of $InAs_{0.82}Sb_{0.18}$ is 0.29 eV corresponding to a wavelength of 4.3 micrometers. At 300 degrees K., the energy is 0.23 eV and the wavelength is 5.4 micrometers. This device may be made by standard LPE, MBE, or CVD similar to the process described for the laser of FIG. 3.

It is to be understood that the above described arrangements are merely illustrative of the many possible specific embodiments which can be devised to represent application of the principles of the invention. Numerous and varied other arrangements can be advised in accordance with these principles by those skilled in the art without departing from the spirit and scope of the invention. In particular, it should be noted that many other (structural) embodiments of DH type lasers are possible. For example, buried heterostructures, various mesa configurations, and separate confinement heterostructures. Moreover, constraining pumping current to flow in a narrow channel in order to control the optical modes parallel to the junction plane can be achieved by laterally-spaced, reverse-biased p-n junctions, as well as by oxide or proton bombardment, as described by R. A. Logan and W-T Tsang in U.S. application Ser. No. 794,466, filed on May 6, 1977 and assigned to the assignee hereof.

In addition to DH laser structures, the material system can be employed to fabricate a spontaneous emitting diode (LED). The LED structure would be the same as the laser structure except that an optical resonator is not required. When the p-n junction of an LED is forward biased, minority carriers are injected into the active region where they undergo radiative recombination and generate spontaneous emission but not stimulated emission. The structure may be such that there is edge emission as in a laser, or broad area emission through the cladding either by use of an annular contact and/or by etching a hole through the substrate as in a Burrus-type structure.

Moreover, in FIG. 3 is should be noted that the substrate 21 and cladding layer 22 both comprise GaSb. Therefore, if the substrate were a high quality material, then it could itself serve as a cladding (thereby omitting the layer 22), provided also that the interface with the InAsSb layer 23 could also be made relatively defect-free.

I claim:

1. A semiconductor device for use as a light emitting diode comprising:

a wide bandgap first cladding layer of one conductivity type, a narrower bandgap active region disposed on a major surface of said first layer, and a wider bandgap second cladding layer of opposite conductivity type disposed on said active region characterized in that said first and second layers comprise $Al_yGa_{1-y}Sb$ where $0 \leq y \leq 1$ and said active region comprises $InAs_xSb_{1-x}$ where $0.82 \leq x \leq 0.91$ approximately, said $Al_yGa_{1-y}Sb$ being substantially lattice matched to said $InAs_xSb_{1-x}$.

2. The device of claim 1 wherein said active region comprises $InAs_xSb_{1-x}$ which is lattice matched to said cladding layers which are selected from the group consisting of AlSb or GaSb so that $x=0.82$ approximately when said cladding layers comprise AlSb and $x=0.91$ approximately when said cladding layers comprise GaSb.

3. The device of claim 1 further including a body comprising single crystal GaSb, a plurality of step-graded substantially lattice matched layers of $Al_yGa_{1-y}Sb$ disposed on a top major surface of said body, the matched layers successively increasing from $y=0$ to $y=1$ with distance from said body, said first cladding layer is formed on said plurality, and said first and second cladding layers comprise AlSb.

4. A double heterostructure laser device comprising an n-type GaSb single crystal body, and n-type GaSb first cladding layer disposed on a major surface of said body, an $InAs_xSb_{1<x}$, laser active region, where $x=0.91$ approximately, disposed on said first cladding layer, a p-type GaSb second cladding layer disposed on said active region, and means for forming an optical resonator at opposite extremities of said active region.

5. A double heterostructure laser device comprising an n-type AlSb single crystal body, an n-type AlSb first cladding layer disposed on a major surface of said body, an $InAs_xSb_{1-x}$ laser active region, where $x=0.82$ approximately, disposed on said first cladding layer, a p-type AlSb second cladding layer disposed on said active region, and means for forming an optical resonator cavity at opposite extremities of said active region.

6. A double heterostructure laser device comprising an n-type body of single crystal GaSb, a plurality of step-graded substantially lattice matched layers of $Al_yGa_{1-y}Sb$ disposed on a top major surface of said body, the matched layers successively increasing from $y=0$ to $y=1$ with distance from said body, an n-type AlSb first cladding layer disposed on a major surface of said plurality, an $InAs_xSb_{1-x}$ laser active region, where $x=0.82$ approximately, disposed on said first cladding layer, a p-type AlSb second cladding layer disposed on said active region, and means for forming an optical resonator cavity at opposite extremities of said active region.

7. A device in accordance with claims 1, 4, 5, or 6, wherein the thickness of said active region is in the range of about 0.15 to 1.5 micrometers.

8. The device of claims 1, 4, 5, or 6 wherein cooling means encompasses said device.

* * * * *